United States Patent [19]

Hashimoto et al.

[11] Patent Number: 5,313,492

[45] Date of Patent: May 17, 1994

[54] DATA MODULATOR/DEMODULATOR

[75] Inventors: Akira Hashimoto, Tokyo; Yusuke Nishimura, Shizuoka, both of Japan

[73] Assignee: NEC Corporation, Japan

[21] Appl. No.: 835,708

[22] Filed: Feb. 12, 1992

[30] Foreign Application Priority Data

Feb. 12, 1991 [JP] Japan .................. 3-038899

[51] Int. Cl.[5] .................. H03K 7/00
[52] U.S. Cl. .................. 375/8; 375/17; 375/36; 375/38; 370/32; 455/73
[58] Field of Search .................. 375/7-8, 375/17, 36-38, 45, 98; 370/32; 455/73

[56] References Cited

U.S. PATENT DOCUMENTS

| | | | |
|---|---|---|---|
| 4,756,007 | 7/1988 | Qureshi et al. | 375/8 |
| 4,860,308 | 8/1989 | Kamerman et al. | 375/8 |
| 4,891,806 | 1/1990 | Farias et al. | 375/39 |
| 5,048,054 | 9/1991 | Eyuboglu et al. | 375/8 |

Primary Examiner—Stephen Chin
Assistant Examiner—Young Tse
Attorney, Agent, or Firm—Ostrolenk, Faber, Gerb & Soffen

[57] ABSTRACT

A data modulator/demodulator (MODEM) for converting main data and subdata to a baseband signal and an FSK (Frequency Shift Keying) modulated wave, respectively, frequency division multiplxing the baseband signal and FSK modulated wave to produce a transmit signal, and sending the transmit signal over a metallic cable. The MODEM controls the levels of the baseband signal and FSK modulated wave on the output thereof in association with the carrier frequency of the FSK modulated wave such that the levels of the baseband signal and FSK modulated wave simultaneously coincide with respective minimum necessary levels of the terminal of the cable at such a terminal. This is successful in maximizing the transmittable distance by making the most of the power of the transmit signal. Especially, when the total output power of the transmit signal is limited, the ratio of the output levels of the baseband signal and FSK modulated wave is changed in matching relation to the data rate to thereby maximize the transmittable distance at each of the data rates.

10 Claims, 5 Drawing Sheets

DATA MODULATOR/DEMODULATOR

BACKGROUND OF THE INVENTION

1. Field of the Invention

The present invention relates to a data modulator/demodulator (MODEM) for a bidirectional data communication system which allows a plurality of computers, work stations or similar data terminals (DTEs) located at remote places in a building or on the premises to interchange data over metallic cables. More particularly, the present invention is concerned with a data MODEM of the type sending main data to be handled by the DTEs and subdata, e.g., network supervisory information to be handled by the data communication system to a metallic cable as a frequency division multiplexed transmit signal.

2. Description of the Prior Art

A data MODEM of the type described includes a modulator which converts the main data in the form of a unipolar signal to a main channel signal of baseband and converts the subdata in the form of a digital signal to a subchannel signal undergone FSK (Frequency Shift Keying) modulation and different in frequency from the main channel signal. The frequency division multiplexed transmit signal made up of the main channel and subchannel signals is fed out to a metallic cable, e.g., a parallel pair line or a coaxial cable. The main data may have any one of a plurality of bit rates (data rates) predetermined on a DTE basis. It is a common practice with the data MODEM to fix the output levels of the main channel and subchannel signals with no regard to the data rate.

The transmit signal fed out from the data MODEM to the metallic cable is sent to a demodulator included in a remote or opposite data MODEM without the intermediary of an exchange or a repeater. The demodulator demodulates the main channel signal and subchannel signal to reproduce the main data and subdata.

The attenuation of the transmit signal on the metallic cable increases with the increase in the transmission distance, and the attenuation constant of the cable is substantially proportional to the square root of frequency. Therefore, the attenuation of the transmit signal increases with the increase in the data rate or the carrier frequency of FSK modulation even when the cable length is constant. This brings about a problem that the transmittable distance of the transmit signal is limited by either of the main channel and subchannel signals since the output levels of the two signals have customarily been fixed, as stated earlier. As a result, the power available with the other channel signal cannot be sufficiently used. Specifically, assume that the carrier frequency for FSK modulation is constant, and that the maximum transmittable distance of the transmit signal is set when the main channel signal has a medium data rate. Then, the power of the main channel signal cannot be effectively used at lower data rates while the power of the subchannel signal cannot be effectively used at higher data rates. Moreover, when the output level of transmission is maintained constant to save the production cost and volume of the data MODEM, the transmittable distance of the main signal critically decreases with the increase in the data rate of the main data.

BRIEF SUMMARY OF THE INVENTION

Objects of the Invention

It is, therefore, an object of the present invention to provide a data MODEM capable of maximizing the transmittable distance of a transmit signal at each data rate of main data by using the power of the transmit signal effectively.

It is another object of the present invention to provide a data MODEM capable of saving the production cost and volume thereof without effecting the long transmittable distance of a transmit signal.

Summary of the Invention

A data MODEM of the present invention has a modulating section in which a main channel modulator converts first main data in the form of a unipolar signal fed from a DTE to a bipolar signal. The main channel demodulator is capable of dealing with first main data having a plurality of predetermined data rates. A first level controller is controlled by a control signal matching the data rate of the first main data and adjusts the bipolar signal to a first predetermined output level matching the data rate, thereby producing a first main channel signal. A subchannel modulator also included in the modulating section converts first subdata fed from a subchannel controller to an FSK modulated wave having a frequency spectrum different from that of the bipolar signal. A second level controller adjusts the FSK modulated wave to a second predetermined output level under the control of the above-mentioned control signal, thereby producing a first subchannel signal. The first main channel and subchannel signals are added by a signal adder to become a frequency division multiplexed first transmit signal and then fed out to a first metallic cable.

A demodulating section regenerates second main data and second subdata from a second transmit signal sent from the modulating section of a remote or opposite data MODEM over a second metallic cable and delivers the second main data and subdata to the DTE and subchannel controller, respectively. Specifically, a main channel demodulator included in the demodulating section AGC (Automatic Gain Control) amplifies a second main channel signal included in the second transmit signal to a predetermined first regeneration level and then regenerates the second main data. A subchannel demodulator also included in the demodulating section AGC amplifies a second subchannel signal included in the second transmit signal to a predetermined second regeneration level and then regenerates the second subdata. The second metallic cable has substantially the same characteristics as the first metallic cable. The second transmit signal has the same signal format as the first transmit signal and has undergone attenuation on the second cable.

The opposite data MODEM has a demodulating section whose input terminates the first metallic cable at the maximum transmittable distance of the first transmit signal. The output levels of the first main channel and subchannel signals included in the first transmit signal are controlled to respective predetermined values each giving respective one of a main channel and a subchannel demodulators of the demodulating section a particular minimum regeneration level. Specifically, even when the output level of the transmit signal on the modulating section output of the data MODEM is constant, the main channel demodulator input level of the first main channel signal in the opposite data MODEM changes with the data rate of the first main data while the subchannel demodulator input level of the first subchannel signal changes with the carrier frequency for the FSK modulation. As a result, the output of the first main channel and subchannel signals on the output of the modulator are controlled to predetermined values matching the data rate of the first main data, the carrier frequency, and the attenuation characteristic of the first metallic cable. Further, when the output level of the first transmit signal from the modulating section has a certain upper-limit due to the limited output power of the signal adder, the levels of the first main channel and subchannel signals are controlled with their level ratio changed under the precondition that the output level of the modulating section be maintained constant.

It is to be noted that when the carrier frequency for the FSK modulation is maintained constant with no regard to the data rate of the first main data, the level of the first main channel signal can be readily determined on the basis of the level of the first subchannel signal.

BRIEF DESCRIPTION OF THE DRAWINGS

The above-mentioned and other objects, features and advantages of the present invention will become more apparent from the following detailed description when taken in conjunction with the accompanying drawings, wherein.

DETAILED DESCRIPTION OF THE PREFERRED EMBODIMENT

Figure 1:
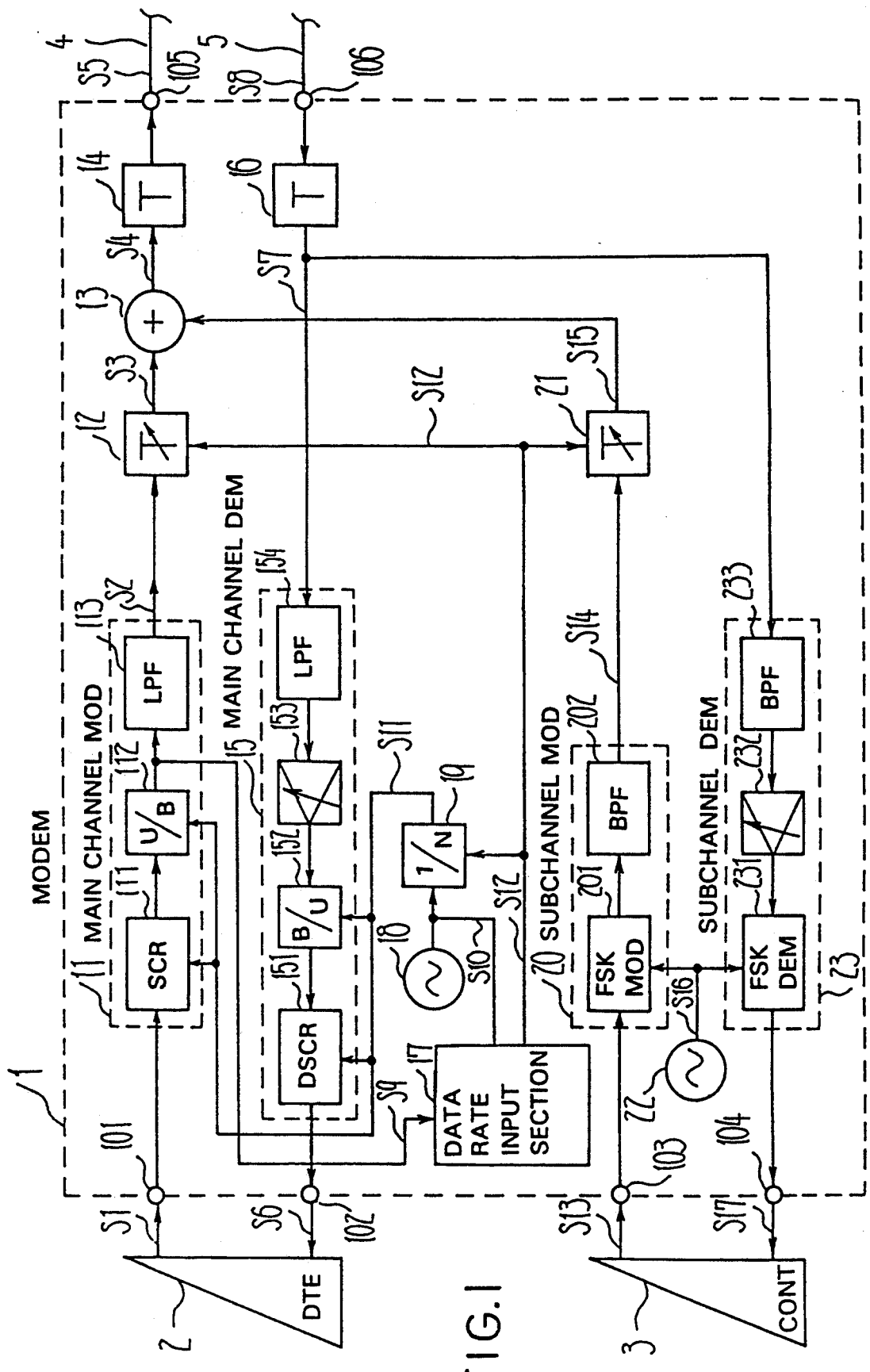
FIG. 1 is a block diagram schematically showing a data MODEM embodying the present invention.

Referring to FIG. 1 of the drawings, a data MODEM embodying the present invention is shown and generally designated by the reference numeral 1. As shown, a computer, work station or similar data terminal equipment (DTE) 2 sends main data S1 implemented as a unipolar signal to a terminal 101 of the data MODEM 1. A subchannel controller 3 supervises various information including the network supervises information of a bidirectional data communication system to which the MODEM 1 belongs. The subchannel controller 3 sends subdata S13 in the form of a digital signal to a terminal 103 of the MODEM 1. The MODEM 1 converts the main data S1 and subdata S13 to a signal S5 to be transmitted, i.e., transmit signal and then sends it over a parallel pair line (e.g. 0.5 mm$\phi$ twisted pair cable for local use; referred to as a 0.5 mm$\phi$ pair line hereinafter), a coaxial cable or similar metallic cable 4 via a terminal 105. On receiving a signal S8 at a terminal 106, the MODEM 1 regenerates main data S6 and subdata S17 and sends the regenerated data S6 and S17 to the DTE 2 and subchannel controller 3, respectively. The main data S1 has one of a plurality of predetermined data rates (e.g. 2.4 kbps, 4.8 kbps, 7.2 kbps, 9.6 kbps, 12.0 kbps, 14.4 kbps, 16.8 kbps, and 19.2 kbps), while the subdata S13 generally has a data rate lower than that of the main data S1 (e.g. 75 bps).

The MODEM 1 has a main channel modulator 11 which transforms the main data S1 to a bipolar signal S2 which is a baseband signal. Specifically, the main channel modulator 11 scrambles the main data S1 by a scrambler (SCR) 111, converts the scrambled main data to a bipolar signal by a unipolar/bipolar converter (U/B) 112, and then removes higher harmonics above the third order by a low pass filter (LPF) 113 having a predetermined pass band. The modulator 11 receives a clock S10 which a frequency divider 19 produces by dividing the frequency of a reference signal S10 from an oscillator 18.

A subchannel modulator 20 generates a bilevel (e.g. 51.2 kHz and 53.7 kHz) FSK modulated signal S14 in response to a carrier signal S16 and the subdata S13. The carrier signal S16 is generated by an oscillator 22 and has a higher frequency (e.g. F0=52.5 kHz) than the bipolar signal S2. Specifically, the modulator 20 effects FSK modulation by an FSK modulator (FSK MOD) 201, and then produces an FSK modulated wave S14 by removing the occupied frequency band of the bipolar signal S2 (substantially lower than 8 kHz when the main data S1 has the maximum data rate 19.2 kHz) from the FSK modulated wave by a BPF 202.

A data rate information input section 17 generates a control signal S12 in response to the bipolar signal from the U/B 112 and the reference signal S10 from the oscillator 18. Assuming that the eight different data rates are available for the main data S1, the control signal S12 may be implemented as 3-bit parallel code. The control signal S12 controls the frequency division ratio of the frequency divider 19 produce a clock S11 whose rate corresponds to the data rate of the main data S1, while controlling level controllers 12 and 21 which will be described. Information relating to the data rate of the main data S1 may be manually inputted, if desired.

The level controller 12 controls the level of the bipolar signal S2 to produce a main channel signal S3, while the level controller 21 controls the level of the FSK modulated wave S14 to produce a subchannel signal S15. A signal adder 13 using, for example, a feedback operational amplifier adds the main channel signal S3 and subchannel signal S15 to produce the signal S4 to be transmitted. In the signal S4, the frequency band of the subchannel signal S15 is frequency division multiplexed higher than the frequency band of the main channel signal S3. A pulse transformer or similar transformer (T) 14 converts the signal S4 to a transmit signal S5 in which the impedance of the signal adder 13 (e.g. 600Ω) and that of the metallic cable 4 (e.g. 110 Ω in the case of the 0.5 mm$\phi$ pair cable) are matched.

The transmit signal S5 is sent over the metallic cable 4 to a remote data MODEM, not shown, which opposes the MODEM 1. The remote or opposite MODEM regenerates the same main data and subdata as the main data S1 and auxiliary data S13 by a demodulating section thereof which is identical with the demodulating section incorporated in the MODEM 1.

The higher the data rate of the main data S1, the greater the attenuation of the main channel signal of the transmit signal S5 on the metallic cable 4 is. Therefore, as the data rate increases, the MODEM 1 increases the level of the main channel signal S3 by the level controller 12 in order to maintain the level of the main channel signal to be fed to the main channel modulator of the opposite MODEM higher than the minimum main data regeneration level. Likewise, the attenuation of the subchannel signal on the metallic cable 4 increases with the increase in the carrier frequency of the subchannel signal S14. Therefore, the MODEM 1 increases the level of the subchannel signal S15 by the level controller 21 to maintain the level of the subchannel signal to be applied to the subchannel demodulator of the opposite MODEM higher than the minimum subdata regeneration level. Generally, the total output power available with the signal adder 12 is limited. In such a case, both of the level controllers 12 and 21 are controlled such that the main channel and subchannel demodulators of the opposite MODEM are each provided with a minimum necessary data regeneration level at a certain transmission distance (transmittable distance) of the transmit signal S5. Specifically, assuming that the transmit signal S4 (or S5) has a constant level (e.g. S5 has a level of 0 dBm), the ratio of the levels of the main channel signal S3 and subchannel signal S15 is changed in matching relation to the data rate of the main data S1 and the carrier frequency of the FSK carrier wave S14.

As shown in FIG. 1, a transmit signal S8 having the same format as the transmit signal S5 having suffered from losses due to the metallic cable 4 arrives at the terminal 106 of the MODEM 1 over the metallic cable 5. A transformer (T) 16 converts the transmit signal S8 to a transmit signal S7 in which the impedance of the metallic cable 5 and the impedance between a main channel demodulator 15 and a subchannel demodulator 23 connected to the transformer 16 are matched. The main channel demodulator 15 regenerates main data S6 out of a main channel signal component (bipolar signal identical with the main channel signal S2) included in the transmit signal S7 and sends the regenerated main data S6 to the DTE 2. Specifically, a low pass filter (LPF) 154 is included in the main channel demodulator 15 and has the same characteristic as the low pass filter 113. The low LPF 154 receives only the main channel signal component included in the transmit signal S7. An AGC (Automatic Gain Control) amplifier 153 amplifies the main channel signal component to a predetermined main data regeneration level and feeds the resulting signal component to a bipolar/unipolar (B/U) converter 152. The B/U 152 converts the bipolar signal to a unipolar signal. Subsequently, a descrambler (DSCR) 151 descrambles the unipolar signal to regenerate main data S6. The clock S11 from the frequency divider 19 is also fed to the main channel demodulator 15. The subchannel demodulator 23 regenerates subdata from a subchannel signal component (FSK modulated wave identical with the subchannel signal S14) included in the transmit signal S7 and sends the regenerated data S17 to the subchannel controller 3. Specifically, a band pass filter (BPF) 233 included in the subchannel demodulator 23 has the same characteristic as the BPF 202 receives only the subchannel signal component included in the transmit signal S7. An AGC amplifier 232 amplifies the subchannel signal component to a predetermined subdata regeneration level and feeds the resulting signal to an FSK demodulator 231. The FSK demodulator 231 demodulates the subdata S17 in response to the FSK carrier wave and the carrier signal S16 fed from the oscillator 22.

To regenerate the main data S6 accurately, it is necessary for the B/U 152 to be supplied with a main channel signal of predetermined main data regeneration level, and this regeneration level is generally limited by the gain of the AGC amplifier 153. Specifically, the main channel signal component included in the transmit signal S8 which arrives at to the MODEM 1 should have a level higher than predetermined one (e.g. −20 dBm at the terminal 106). Likewise, the subdata S17 cannot be accurately regenerated unless a subchannel signal of predetermined subdata regeneration level is applied to the FSK demodulator 152, and this regeneration level is generally limited by the gain of the AGC amplifier 232. Specifically, the subchannel signal component included in the transmit signal S8 should also have a level higher than predetermined one (e.g. −40 dBm at the terminal 106). When the main channel and subchannel signal components of the transmit signal S8 have the same level as each other as measured on the terminal 106, the power of the transmit signal S8 (i.e. transmit signal S5) is used most effectively to maximize the transmittable distance of the transmit signal S8 (and transmit signal S5 transmitted via the terminal 105) under given conditions.

Figure 2:
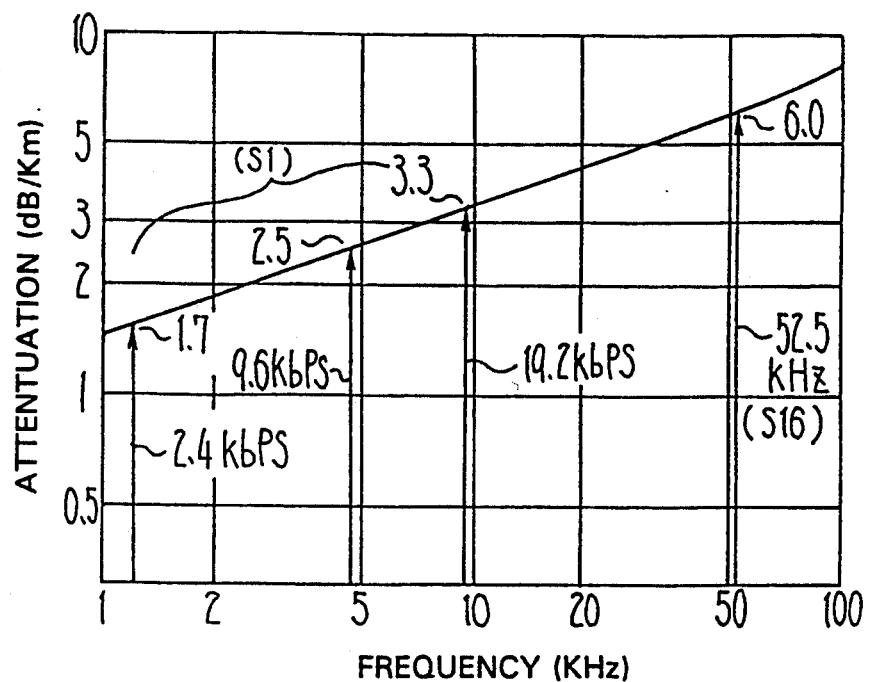
FIG. 2 is a graph showing an attenuation to frequency characteristic particular to a 0.5 mm$\phi$ twisted pair cable for local use which is a specific form of metallic cables included in the embodiment.

Referring to FIG. 2, the attenuation of the 0.5 mm$\phi$ pair lines implementing the metallic cables 4 and 5 increases substantially in proportion to the square root of frequency. Specifically, the main channel signal component included in the transmit signal S5 (or transmit signal S8) which is transmitted over the cable 4 (or 5) undergoes greater attenuation as the data rate of the main data S1 increases. Since the frequency spectrum of the main channel signal component has a center frequency which is one-half of the data rate of the main data S1, the attenuation of the main channel signal component may be considered with respect to the center frequency. Therefore, when the main data S1 has data rates of 2.4 kbps, 9.6 kbps and 19.2 kbps, the attenuations of the main channel signal components are about 1.7 dB/km, 2.5 dB/km, and 3.3 dB/km, respectively. On the other hand, the attenuation of the subchannel signal component included in the transmit signal S5 may be considered with respect to the frequency of the carrier signal S16; assuming that the frequency is 52.5 kHz as described in relation to the embodiment, the attenuation is about 6.0 dB/km.

Figure 3:
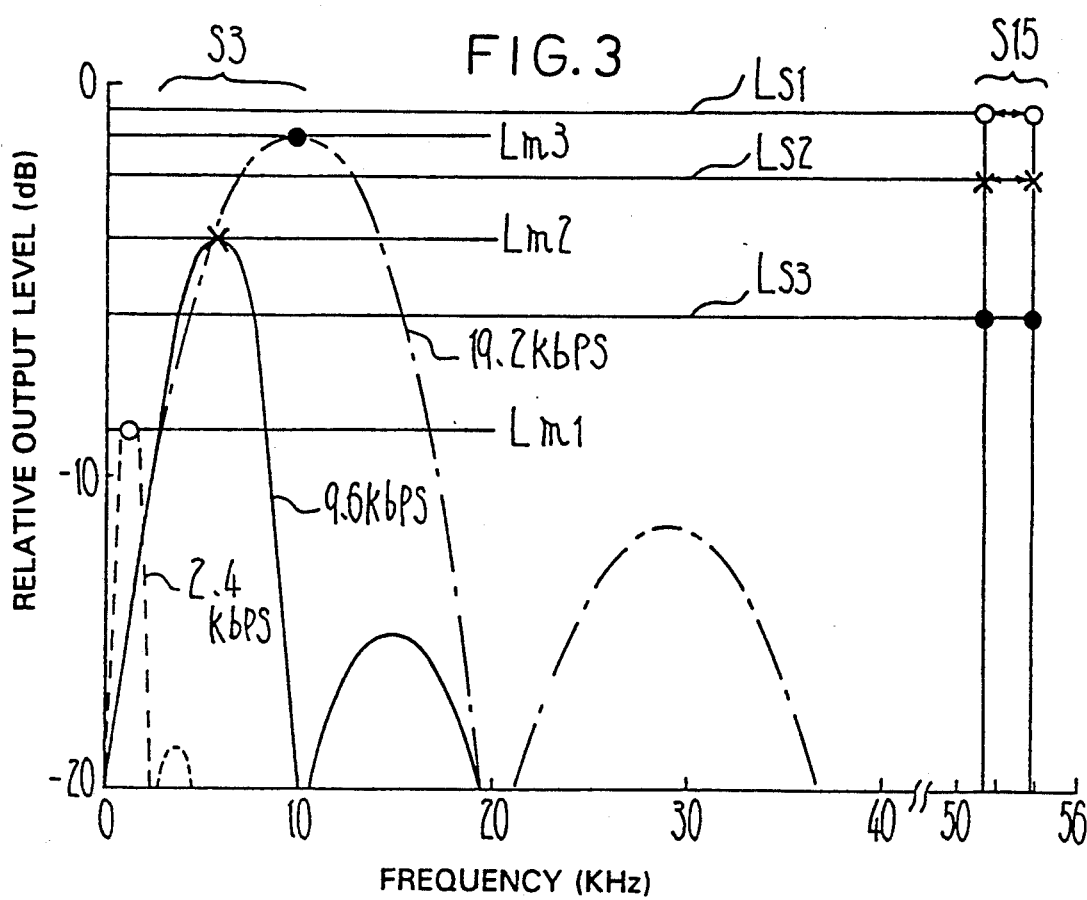
FIG. 3 shows the relative output levels of a main channel and a subchannel signal of the embodiment together with frequency spectra.

In the MODEM having specifications described in relation to FIG. 1, assume that the signal adder 13 has a constant output level, i.e., the transmit signal S5 has a constant power level. FIG. 3 shows a relation between the relative output levels of the main channel signal S3 and subchannel signal S15 for obtaining the maximum transmittable distance of the signal S5 as well as the frequency spectra of the signals S3 and S15 in the above-mentioned condition. It is to be noted that FIG. 3 assumes that the carrier frequency of the subchannel signal S15 is constant (52.5 kHz), and indicates only the main channel signal S3 having three different data rates (2.4 kbps, 9.6 kbps, and 19.2 kbps). To maximize the transmittable distance of the signal S5 under the condition that the level of the transmit signal S5 (or transmit signal S4) measured at the terminal 105 is limited with no regard to the data rate of the main data S1, it is necessary that the remote data MODEM sets both the main channel and subchannel signal components of the transmit signal S8 at the respective predetermined regeneration levels simultaneously at the input of the demodulator at the maximum transmittable distance. The main channel signal S3, therefore, has the level thereof increased with the increase in the attenuation on the metallic cable 4 (or cable 5) which in turn increases with the increase in the data rate of the main data S1. Conversely, when the carrier frequency is fixed, the subchannel signal S15 has the level thereof reduced by an amount corresponding to the increase in the level of the main channel signal S3. Specifically, when the data rate of the main data S1 is lowest 2.4 kbps, the level of the main channel signal S3 should only be the lowest level Lm1. Under this condition, the maximum level Ls1 can be given to the subchannel signal S15. When the data rate is medium 9.6 kbps, the level of the main channel signal S3 is also medium Lm2, and the level of the subchannel signal S15 is also medium Ls2. Further, when the data rate of the main data S1 is highest 19.2 kbps, the main channel signal S3 needs the highest level Lm3 while the subchannel signal S15 should only have the lowest level Ls3. In this manner, by changing the ratio of the levels of the main channel and subchannel signals S3 and S15 in association with the data rate of main data, it is possible to maximize the transmittable distance of the signal S5 under given conditions on a data rate basis (e.g. limited output power of the adder 13 and Lm+Ls=constant value). Although the second-order higher harmonics of the main channel signal S3 fed to the main channel demodulator 15 undergoes greater attenuation on the metallic cable 4 (or 5) than the fundamental components, the former is far lower in level than the latter and, therefore, has a minimum of adverse influence on the regeneration of main data.

Figure 4:
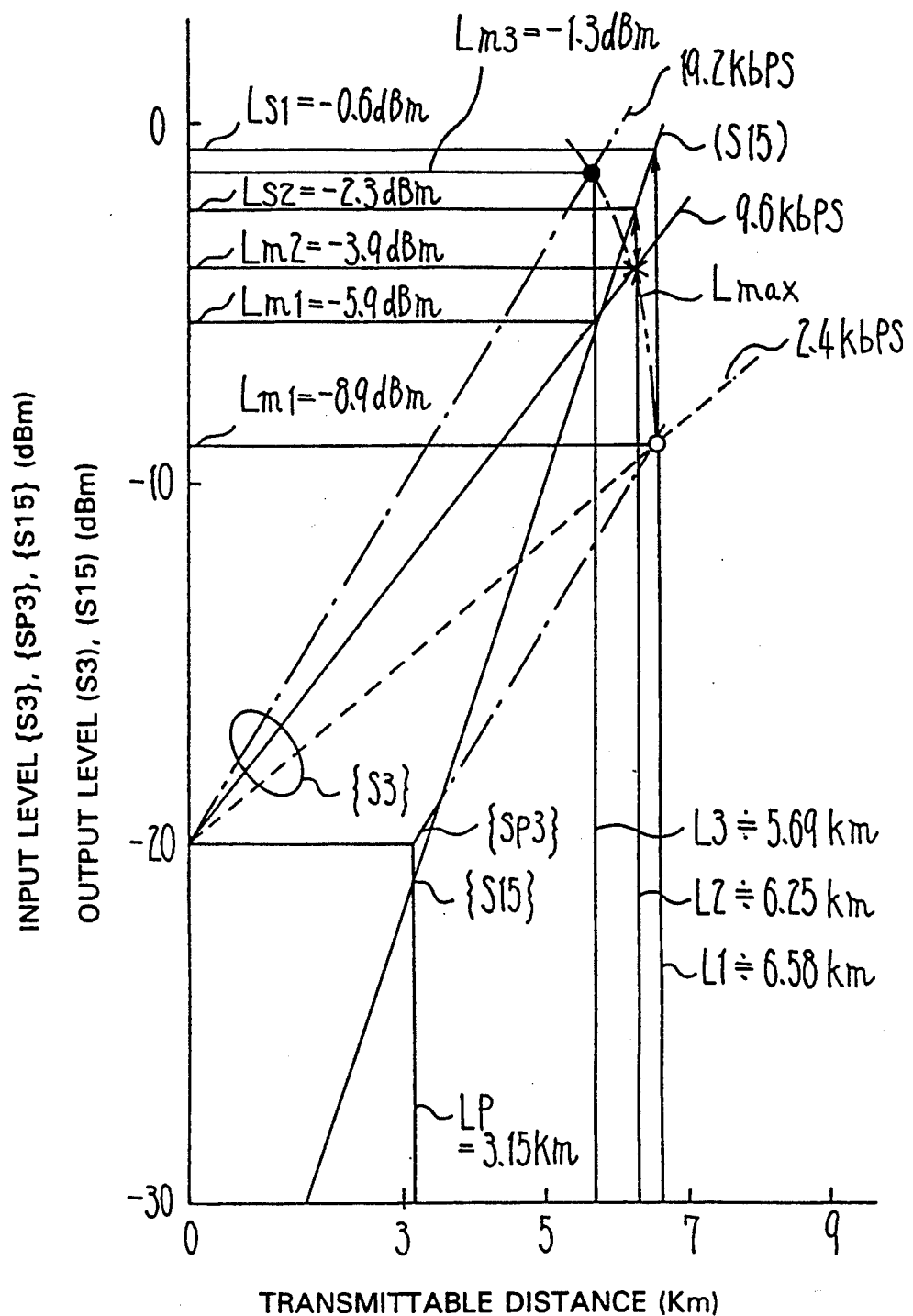
FIG. 4 indicate specific output levels of the main channel and subchannel signals on the output of a modulating section and which give the maximum transmittable distance of a transmit signal when the transmit signal output level is constant.

In the MODEM 1 having the previously stated specifications, assume that the transmit signal S5 has a power level P0 of 0 dBm on the terminal 105, and that a minimum necessary level Pmi of −20 dBm and a minimum necessary level Psi of −40 dBm are respectively assigned to the main channel and subchannel signals of the transmit signal S5 (identical with S8) on the input terminal of the demodulator of the remote MODEM (identical with terminal 106). FIG. 4 shows the levels Lm of the main channel signal (labeled S3 hereinafter) and the levels Ls of the subchannel signal (labeled S15 hereinafter) which are included in the signal S5 that gives the maximum transmittable distance Lmax (km) to the signal S5 under the above conditions. The maximum transmittable distance Lmax of the transmit signal S5 associated with each data rate can be determined by solving the following equations:

$$Lm + Ls = 1 \quad (1: \text{power level of 0 } dBm) \quad (1)$$

$$Psi = -20 = 10 \log (Lm \times \alpha f^{Lmax}) \quad (2)$$

$$Psi = -40 = 10 \log (Ls \times \alpha f^{Lmax}) \quad (3)$$

where αf is the attenuation constant of the 0.5 mmφ pair line associated with each frequency, i.e., αf (1.2 kHz)≈0.68 (1.7 dB/Km), αf (4.8 kHz)≈0.55 (2.5 dB/km), αf (9.6 kHz)≈0.47 (2.5 dB/km), and αf (52.5 kHz)≈0.25 (6.0 dB/km).

Specifically, assuming that the data rate of the main data S1 is 2.4 kbps, then the level Lm1 of the main channel signal (S3) is −8.9 dBm, the level Ls1 of the subchannel signal (S15) is −0.6 dBm, and the transmittable distance L1 is approximately 6.58 km. Likewise, assuming that the data rate of the main data S1 is 9.6 kbps, then the signal (S3) level Lm2 is −3.9 dBm, the signal (S15) level Ls2 is −2.3 dBm, and the transmittable distance L2 is approximately 6.25 km. Further, assuming that the data rate is 19.2 kbps, then the signal (S3) level Lm3 is −1.3 dBm, the signal (S15) level Ls3 is −5.9 dBm, and the transmittable distance L3 is approximately 5.69 km.

Assume that the main channel signal (S3) level and the subchannel signal (S15) level included in the transmit signal S5 are respectively fixed at Lm=−8.9 and Ls=−0.6 dBm which give the maximum transmittable distance Lmax of nearly equal to 6.58 km when the data rate of the main data S1 is 2.4 kbps, as has been customary in the art. Then, the transmittable distance Lp associated with the data rate of 19.2 kbps will be reduced to about 3.1 km despite that the subchannel signal (S15) level on the input terminal of the demodulator of the remote MODEM has a margin (021 dBm), since the main channel signal (S3) level is limited. As shown in FIG. 4, by changing the level ratio of the main channel signal (S3) and subchannel signal (S15) adequately in association with the data rate of the main data S1, it is possible to achieve a more than 2 km longer transmittable distance L than the conventional MODEM in the case of the data rate of 19.2 kbps.

Figure 5:
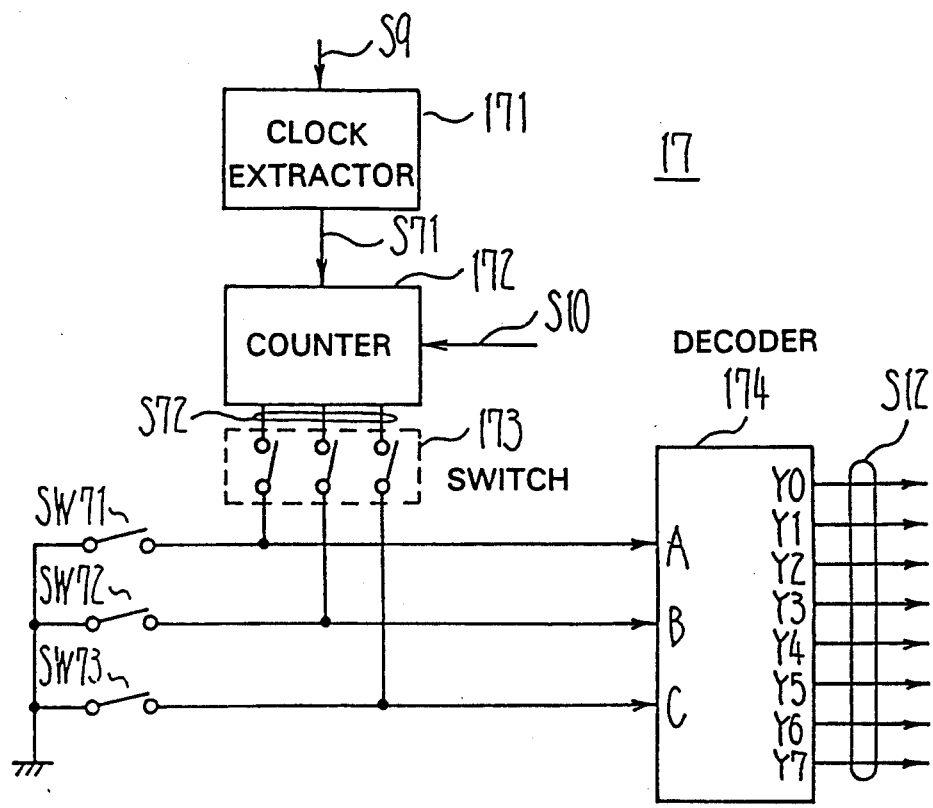
FIG. 5 is a block diagram schematically showing a specific construction of a data rate information inputting section included in the embodiment.

Referring to FIG. 5, the data rate information input section 17 has a clock extractor 171 which extracts a clock S71 of a bipolar signal fed from the U/B 112, not shown, included in he main channel modulator 11. A counter 172 counts the clock S71 per period in response to the clock S71 and the reference signal S10 from the oscillator 18, not shown, compares the resulting count with eight different data rates stored beforehand to thereby determine which data rate the clock S71 matches, and outputs the result of decision as a 3-bit parallel code S72. When a switch circuit 173 is in an ON state, the parallel code S72 is fed to a decoder 174 via the switch circuit 173. The decoder 174 converts the parallel code S72 to the previously stated control signal S12 and feeds it out over one of eight output lines each corresponding to a particular data rate. The data rate information associated the main data S1 may be manually inputted to the decoder 174 by disconnecting the switch circuit 173 from the counter 172 and then turning on and off three switches SW71, SW72 and SW73 each being connected to ground at one end thereof.

Figure 6:
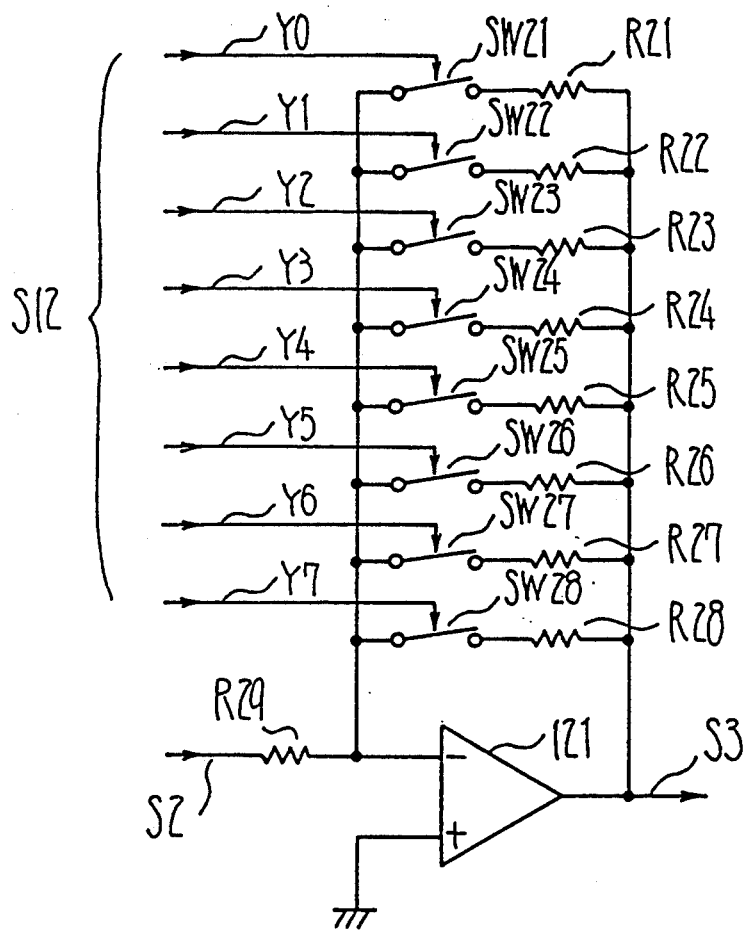
FIG. 6 is a circuit diagram showing a specific construction of a level controller also included in the embodiment.

As shown in FIG. 6, the level controller 12 is implemented by a feedback amplifier made up of an operational amplifier 121, eight switchable feedback circuits, and an input resistor R29. The feedback circuits are constituted by resistors (R21-R28) and switches (SW21-SW28). The feedback circuits have feedback resistors and switches designated by the same reference numerals in pairs. The level controller 12 amplifies the bipolar signal S2 by an amplification which is determined by one of the feedback circuits selected by the control signal S12 and the input resistor R29, thereby producing the main channel signal S3.

As stated above, the data MODEM 1 maximizes the transmittable distance Lmax of the transmit signal S5 at each data rate of the main data S1. For this purpose, the MODEM 1 changes the levels of the main channel and subchannel signals on the modulator output thereof in matching relation to the data rate of the main data S1 such that the main channel and subchannel signals of the transmit signal S5 on the input of the demodulator of the remote MODEM have respective minimum necessary levels. Further, even when the output level of the transmit signal S5 is provided with a certain upper limit to save the production cost and size of the apparatus, the transmittable distance Lmax can be maximized within the limitation if the level ratio of the main channel and subchannel signals is changed in association with the data rate.

Although the invention has been described with reference to the specific embodiment, this description is not meant to be construed in a limited sense. Various modifications of the disclosed embodiment, as well as other embodiments of the invention, will become apparent to persons skilled in the art upon reference to the description of the invention. It is therefore contemplated that the appended claims will cover any modifications or embodiments as fall within the true scope of the invention.

What is claimed is:

1. A data modulator/demodulator (MODEM) for a bidirectional data communication system, comprising:
    main channel modulating means for modulating input first main data to a first main channel signal;
    subchannel modulating means for modulating input first subdata to a first subchannel signal having a frequency spectrum different from a frequency spectrum of said first main channel signal;
    multiplexing means for frequency division multiplexing said first main channel signal and said first subchannel signal to thereby produce a first transmit signal;
    transmitting means for transmitting said first transmit signal over a first metallic cable;
    splitting means for receiving a second transmit signal identical in format with said first transmit signal over a second metallic cable having substantially the same attenuation characteristic as said first metallic cable and splitting said second transmit signal into a second main channel signal and a second subchannel signal;
    main channel demodulating means for regenerating second main data from said second main channel signal;
    subchannel demodulating means for regenerating second subdata from said second subchannel signal;
    said first main data selectively having one of a plurality of predetermined data rates;
    data rate information inputting means for generating a control signal matching said one data rate of said first main data;
    first level controlling means for controlling the output level of said first main channel signal to a predetermined level in response to said control signal; and
    second level controlling means for controlling the output level of said first subchannel signal to a predetermined level in response to said control signal.

2. A data MODEM as claimed in claim 1, wherein said first main channel signal comprises a baseband signal produced by converting said first main data which is a unipolar signal to a bipolar signal, said first subchannel signal comprising an FSK modulation wave produced by FSK modulating a carrier signal by said first subdata which is a digital signal.

3. A data MODEM as claimed in claim 2, wherein said carrier signal has a higher fixed frequency than said baseband signal.

4. A data MODEM as claimed in claim 2, wherein said data rate information inputting means generates said control signal in response to said bipolar signal fed from said main channel modulating means.

5. A data MODEM as claimed in claim 2, wherein said levels to be respectively selected by said first and second level controlling means in response to said control signal are such that the levels of said first main channel and subchannel signals at the terminal of said first metallic cable simultaneously coincide with respective predetermined cable terminal levels.

6. A data MODEM as claimed in claim 5, wherein the total output power level of said first transmit signal to be produced by said multiplexing means is limited to a predetermined value;
    said predetermined levels to be respectively selected by said first and second level controlling means are such that the transmittable distance of said first transmit signal is maximized at each of said data rates of said main data.

7. A data MODEM as claimed in claim 6, wherein said first and second level controlling means each comprises a feedback type operational amplifier having a predetermined amplification or a predetermined attenuation matching each of said control signals.

8. A data MODEM as claimed in claim 2, wherein said main channel demodulating means comprises first AGC amplifying means for amplifying said second main channel signal to the regeneration level of said second main data, and bipolar/unipolar converting means for converting said second channel signal of said regeneration level to a unipolar signal;
    said subchannel modulating means comprising second AGC amplifying means for amplifying said second subchannel signal to the regeneration level of said second subdata, and FSK demodulating means for regenerating said second subchannel signal of said regeneration level to produce said second subdata.

9. A data MODEM as claimed in claim 1, wherein said levels to be respectively selected by said first and second level controlling means in response to said control signal are such that the levels of said first main channel and subchannel signals at the terminal of said first metallic cable simultaneously coincide with respective predetermined cable terminal levels.

10. A data MODEM as claimed in claim 9, wherein the total output power level of said first transmit signal to be produced by said multiplexing means is limited to a predetermined value;
    said predetermined levels to be respectively selected by said first and second level controlling means are such that the transmittable distance of said first transmit signal is maximized at each of said data rates of said main data.

* * * * *